(12) United States Patent
Pang et al.

(10) Patent No.: US 11,723,228 B2
(45) Date of Patent: Aug. 8, 2023

(54) DISPLAY DEVICE WITH ORGANIC PATTERNS IN NON-DISPLAY AREA

(71) Applicant: LG Display Co., Ltd., Seoul (KR)

(72) Inventors: HeeSuk Pang, Paju-si (KR); JooHwan Shin, Paju-si (KR); MinHo Oh, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 395 days.

(21) Appl. No.: 17/021,441

(22) Filed: Sep. 15, 2020

(65) Prior Publication Data
US 2021/0098737 A1 Apr. 1, 2021

(30) Foreign Application Priority Data
Sep. 27, 2019 (KR) .......................... 10-2019-0119900

(51) Int. Cl.
*H10K 50/842* (2023.01)
*H10K 50/84* (2023.01)
*H10K 59/126* (2023.01)
*H10K 59/131* (2023.01)

(52) U.S. Cl.
CPC ....... *H10K 50/8426* (2023.02); *H10K 50/846* (2023.02); *H10K 59/126* (2023.02); *H10K 59/131* (2023.02)

(58) Field of Classification Search
CPC ............. H01L 51/5246; H01L 51/5259; H01L 27/3272; H01L 27/3276; H10K 50/8426; H10K 50/846; H10K 59/131; H10K 59/126

See application file for complete search history.

(56) References Cited

U.S. PATENT DOCUMENTS

| | | | |
|---|---|---|---|
| 10,529,782 B2 | 1/2020 | Shin et al. | |
| 2016/0380040 A1* | 12/2016 | Tada | H01L 27/3279 257/72 |
| 2017/0031323 A1* | 2/2017 | Kim | H01L 27/3258 |
| 2017/0062528 A1* | 3/2017 | Aoyama | G02F 1/133514 |
| 2017/0148856 A1* | 5/2017 | Choi | H01L 27/3258 |
| 2017/0237038 A1* | 8/2017 | Kim | H01L 51/5253 257/40 |

(Continued)

FOREIGN PATENT DOCUMENTS

| KR | 10-2017-0135587 A | 12/2017 |
|---|---|---|
| KR | 10-2018-0035983 A | 4/2018 |

*Primary Examiner* — Lex H Malsawma
(74) *Attorney, Agent, or Firm* — Morgan, Lewis & Bockius LLP

(57) ABSTRACT

A display device may prevent signal lines in a non-display area from being damaged by particles. The display device may include a first substrate including a display area and a non-display area, a first electrode in the display area over the first substrate, a light emitting layer over the first electrode, a second electrode over the light emitting layer, lines in the non-display area over the first substrate, organic patterns over the lines and spaced apart from one another, an adhesive layer over the organic patterns, and a second substrate over the adhesive layer. The light emitting layer and the second electrode are provided from the display area to the non-display area, and spaced distances among the organic patterns are shorter than a distance from an upper surface of the second electrode provided over the organic patterns to an upper surface of the adhesive layer.

20 Claims, 10 Drawing Sheets

(56) References Cited

U.S. PATENT DOCUMENTS

| | | | |
|---|---|---|---|
| 2019/0074479 A1* | 3/2019 | Lee .................... | H01L 51/5253 |
| 2019/0181373 A1* | 6/2019 | Kim ................... | H01L 27/3276 |
| 2020/0144341 A1* | 5/2020 | Choi ................... | H01L 27/3246 |
| 2020/0161582 A1* | 5/2020 | Choi ................... | H01L 51/5253 |

* cited by examiner

… (1)

DISPLAY DEVICE WITH ORGANIC PATTERNS IN NON-DISPLAY AREA

This application claims the benefit of Korean Patent Application No. 10-2019-0119900, filed Sep. 27, 2019, which is hereby incorporated by reference.

BACKGROUND

Technical Field

The present disclosure relates to a display device.

Discussion of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device have been widely utilized.

A display device is categorized into a display area where pixels are disposed, and a non-display area surrounding the display area. The non-display area is provided with a plurality of signal lines supplying signals or powers to pixels arranged in the display area. The plurality of signal lines provided in the non-display area are likely to be damaged by particles entering the inside of the display device.

SUMMARY

Accordingly, embodiments of the present disclosure are directed to a display device that substantially obviates one or more of the problems due to limitations and disadvantages of the related art.

The present disclosure has been made in view of the above problems, and an object of the present disclosure is to provide a display device that may prevent a plurality of signal lines provided in a non-display area from being damaged by particles.

Another object of the present disclosure is to provide a display device that may prevent external water or oxygen from being permeated into a light emitting diode provided in a display area without forming a separate encapsulation film.

Yet another object of the present disclosure is to provide a display device that may embody a narrow bezel.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a first substrate including a display area and a non-display area surrounding the display area, a first electrode provided in the display area over the first substrate, a light emitting layer provided over the first electrode, a second electrode provided over the light emitting layer, a plurality of lines provided in the non-display area over the first substrate, a plurality of organic patterns provided over the plurality of lines and spaced apart from one another, an adhesive layer provided over the plurality of organic patterns, and a second substrate provided over the adhesive layer. The light emitting layer and the second electrode are provided from the display area to the non-display area, and spaced distances among the plurality of organic patterns are shorter than a distance from an upper surface of the second electrode provided over the plurality of organic patterns to an upper surface of the adhesive layer.

In another aspect, a display device comprises a substrate including a display area and a non-display area surrounding the display area, a first electrode provided in the display area over the substrate, a light emitting layer provided over the first electrode, a second electrode provided over the light emitting layer, and a plurality of organic patterns provided in the non-display area. The non-display area includes a first area provided with the plurality of organic patterns and a second area provided among the plurality of organic patterns. The light emitting layer and the second electrode are provided in the display area, the first area and the second area, and are provided over the plurality of organic patterns in the first area.

According to the present disclosure, the plurality of organic patterns are provided over the plurality of signal lines arranged in the non-display area to prevent the plurality of signal lines from being damaged by particles entering the inside of the display panel.

Also, according to the present disclosure, the plurality of organic patterns are spaced apart from one another to prevent water or oxygen from being delivered to the display area through the plurality of organic patterns.

Also, according to the present disclosure, the adhesive layer that includes a water absorption material is formed, whereby a separate encapsulation film may not be formed. Therefore, the present disclosure may reduce a thickness of the display panel and a width of the non-display area.

Also, according to the present disclosure, an organic pattern having a simple stack structure is provided between organic patterns having an undercut structure, whereby adhesion may be more improved.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION DISCLOSURE

Figure 1:
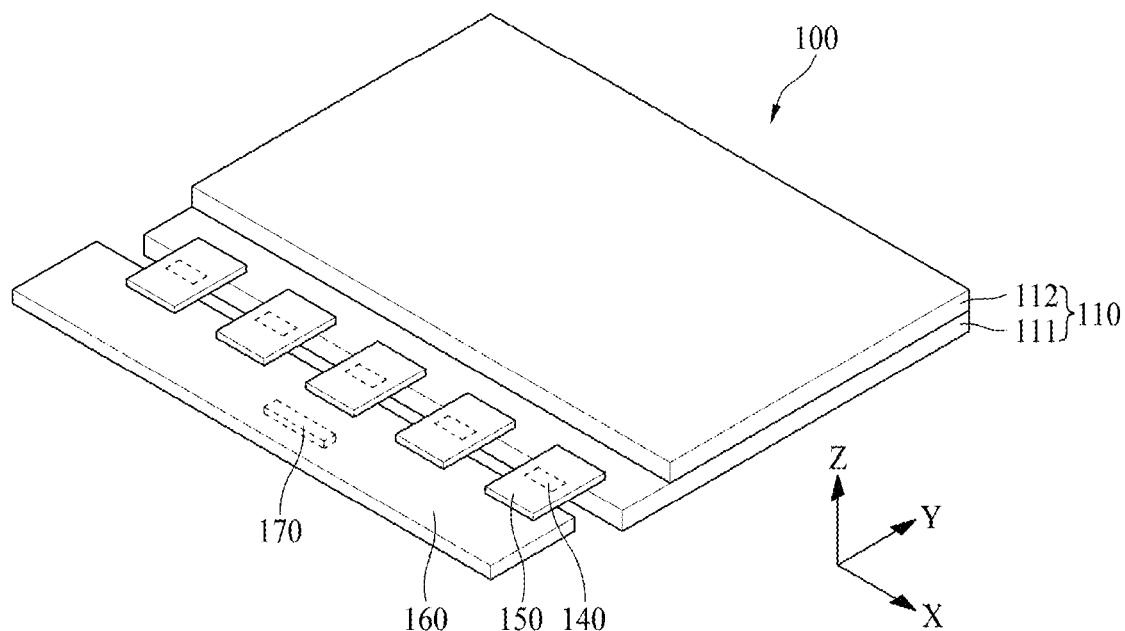
FIG. 1 is a perspective view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In the case in which "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display device according to the present disclosure will be described in detail with reference to the accompanying drawings. Wherever possible, the same reference numbers will be used throughout the drawings to refer to the same or like parts.

Figure 2:
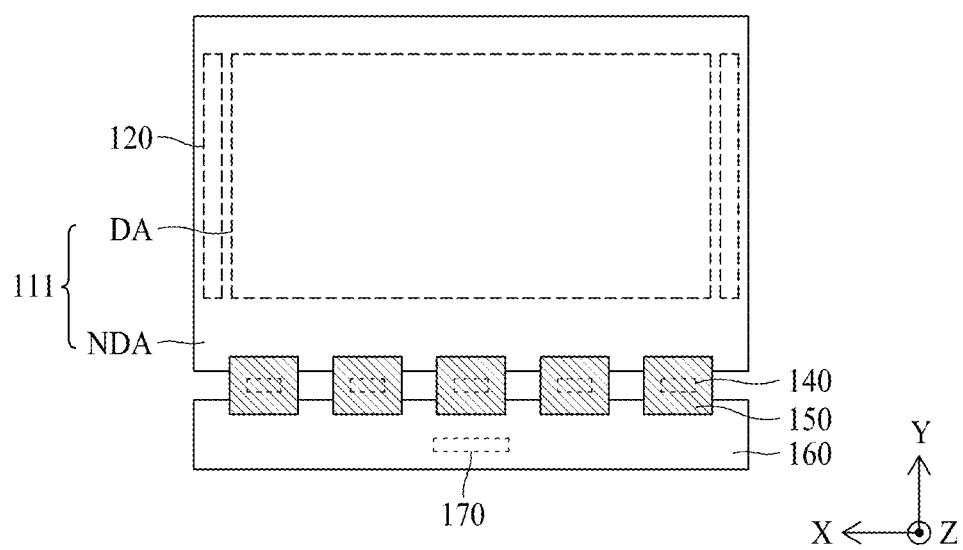
FIG. 2 is a plane view illustrating a first substrate, a source drive IC, a flexible film, a circuit board, and a timing controller of FIG. 1.

FIG. 1 is a perspective view illustrating a display device according to one embodiment of the present disclosure, and FIG. 2 is a plane view illustrating a first substrate, a source drive IC, a flexible film, a circuit board, and a timing controller of FIG. 1.

An example where the transparent display apparatus 100 according to an embodiment of the present disclosure is implemented as an organic light emitting display apparatus will be mainly described, but the transparent display apparatus 100 may be implemented as a liquid crystal display (LCD) apparatus, a plasma display panel (PDP), a quantum dot light emitting display (OLED) apparatus, or an electrophoresis display apparatus.

Referring to FIGS. 1 and 2, the display device 100 according to one embodiment of the present disclosure includes a display panel 110, a source drive integrated circuit 140 (hereinafter, referred to as "IC"), a flexible film 150, a circuit board 160, and a timing controller 170.

The display panel 110 includes a first substrate 111 and a second substrate 112. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film.

The display device 100 according to one embodiment of the present disclosure may be formed in a bottom emission type where emitted light advances downwardly, but not limited to this type. If the display device 100 is formed in the bottom emission type where emitted light advances downwardly, the first substrate 111 may be formed of a transparent material, and the second substrate 112 may be formed of an opaque material as well as a transparent material. Meanwhile, the display device 100 according to one embodiment of the present disclosure is formed in a top emission type where emitted light advances upwardly, the first substrate 111 may be formed of an opaque material as well as a transparent material, and the second substrate 112 may be formed of a transparent material.

On one surface of the first substrate 111 confronting the second substrate 112, there are gate lines, data lines, and pixels. The pixels are prepared in respective areas defined by crossing the gate lines and the data lines.

Each of the pixels may include a thin film transistor (TFT), and a light emitting device including a first electrode, an emission layer, and a second electrode. If a gate signal is supplied from the gate line to each pixel through the use of TFT, a predetermined current is supplied to the light emitting device in accordance with a data voltage of the data line. Accordingly, when a high potential voltage is applied to the anode electrode, and a low potential voltage is applied to the cathode electrode, the light emitting device for each of the pixels may emit light with a predetermined brightness in accordance with the predetermined current.

The display panel 110 may include a display area DA provided with the sub pixels for displaying an image, and a non-display area NDA in which an image is not displayed. The gate lines, the data lines, and the pixels may be provided in the display area DA, and a gate driver 120 and pads may be provided in the non-display area NDA.

The gate driver 120 supplies gate signals to the gate lines in accordance with a gate control signal which is provided from the timing controller 170. The gate driver 120 may be provided in one side of the display area DA of the display panel 110, or the non-display area NDA of both peripheral sides of the display panel 110 by a gate driver in panel (GIP) method. In another way, the gate driver 120 may be manufactured in a driving chip, may be mounted on the flexible film, and may be attached to one side of the display area DA of the display panel 110, or the non-display area NDA of both peripheral sides of the display panel 110 by a tape automated bonding (TAB) method.

The source drive IC 140 receives digital video data and source control signals from the timing controller 170. The source drive IC 140 converts the digital video data into analog data voltages in accordance with the source control signal, and supplies the analog data voltages to the data lines. If the source drive IC 140 is manufactured in a driving chip, the source drive IC 140 may be mounted on the flexible film 150 by a chip on film (COF) method or a chip on plastic (COP) method.

The pads such as data pads may be provided in the non-display area NDA of the display panel 110. In the flexible film 150, there are lines for connecting the pads with the source drive IC 140, and lines for connecting the pads with the lines of the circuit board 160. The flexible film 150 is attached to the pads by the use of anisotropic conducting film, whereby the pads may be connected with the lines of the flexible film 150.

The circuit board 160 may be attached to the flexible film 150. A plurality of circuits, which are realized in a plurality of driving chips, may be mounted on the circuit board 160. For example, the timing controller 170 may be mounted on the circuit board 160. The circuit board 160 may be a printed circuit board or a flexible printed circuit board.

The timing controller 170 receives digital video data and a timing signal from an external system board via a cable of the circuit board 160. The timing controller 170 generates the gate control signal for controlling an operation timing of the gate driver and the source control signal for controlling the source drive IC 140 on the basis of the timing signal. The timing controller 170 supplies the gate control signal to the gate driver, and supplies the source control signal to the source drive IC 140.

Figure 3:
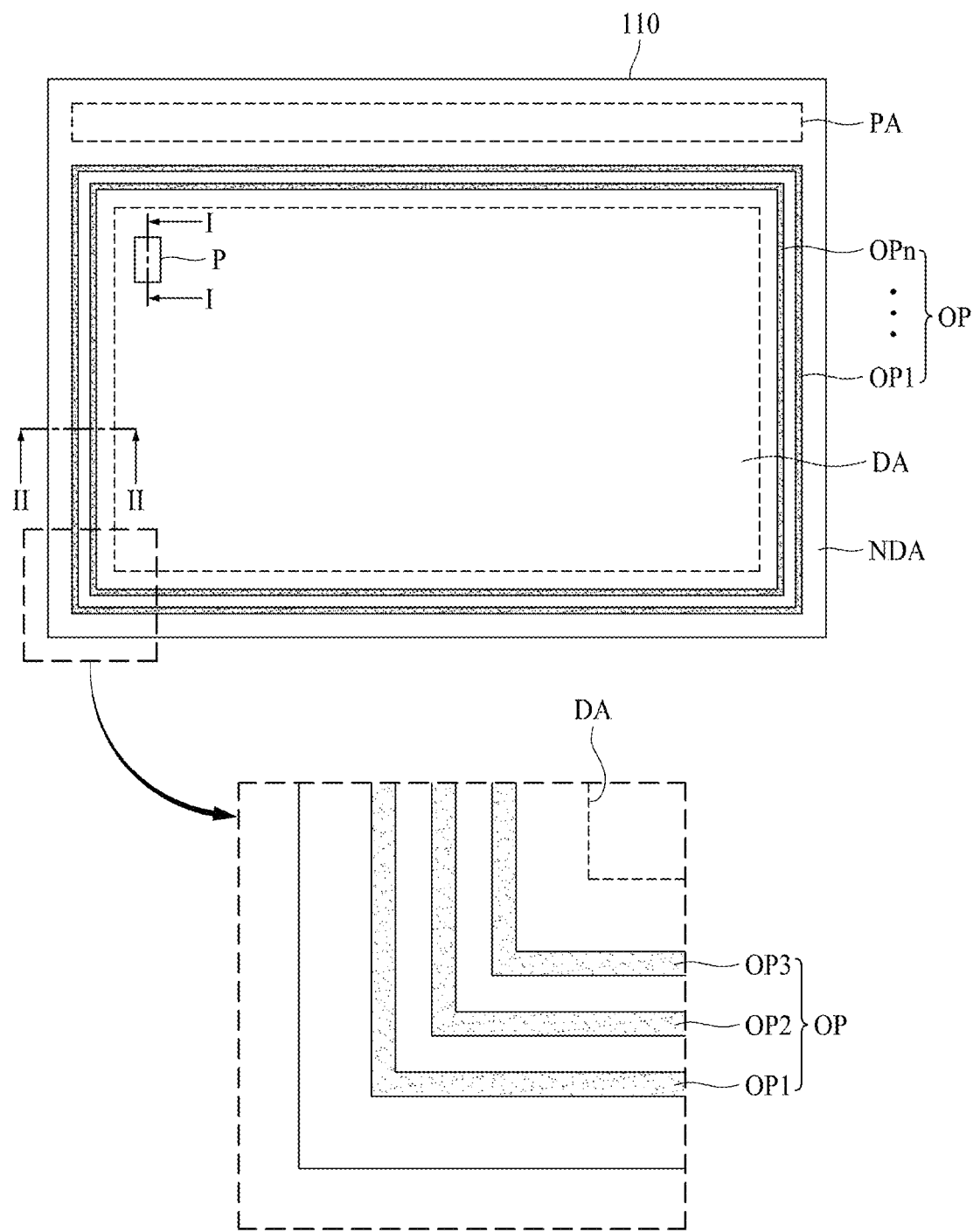
FIG. 3 is a schematic plane view illustrating a display panel according to one embodiment of the present disclosure.
Figure 4:
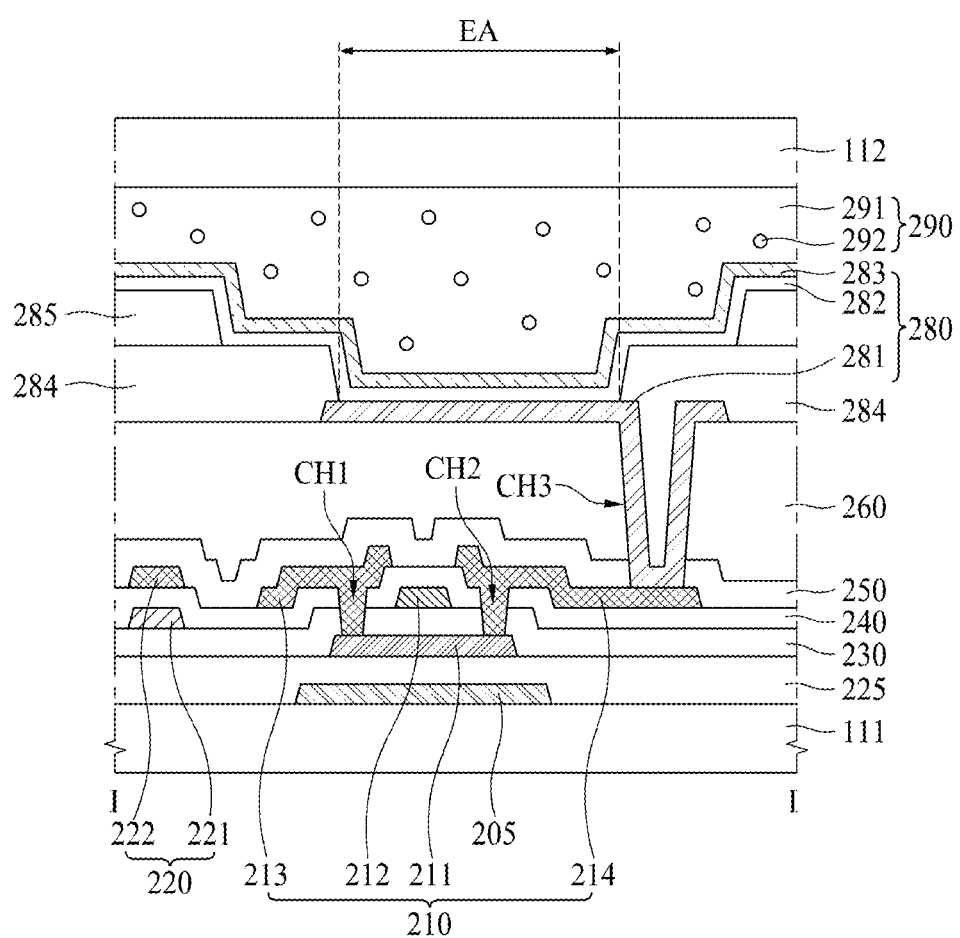
FIG. 4 is a cross-sectional view illustrating an example of a pixel of a display area of FIG. 3.
Figure 5:
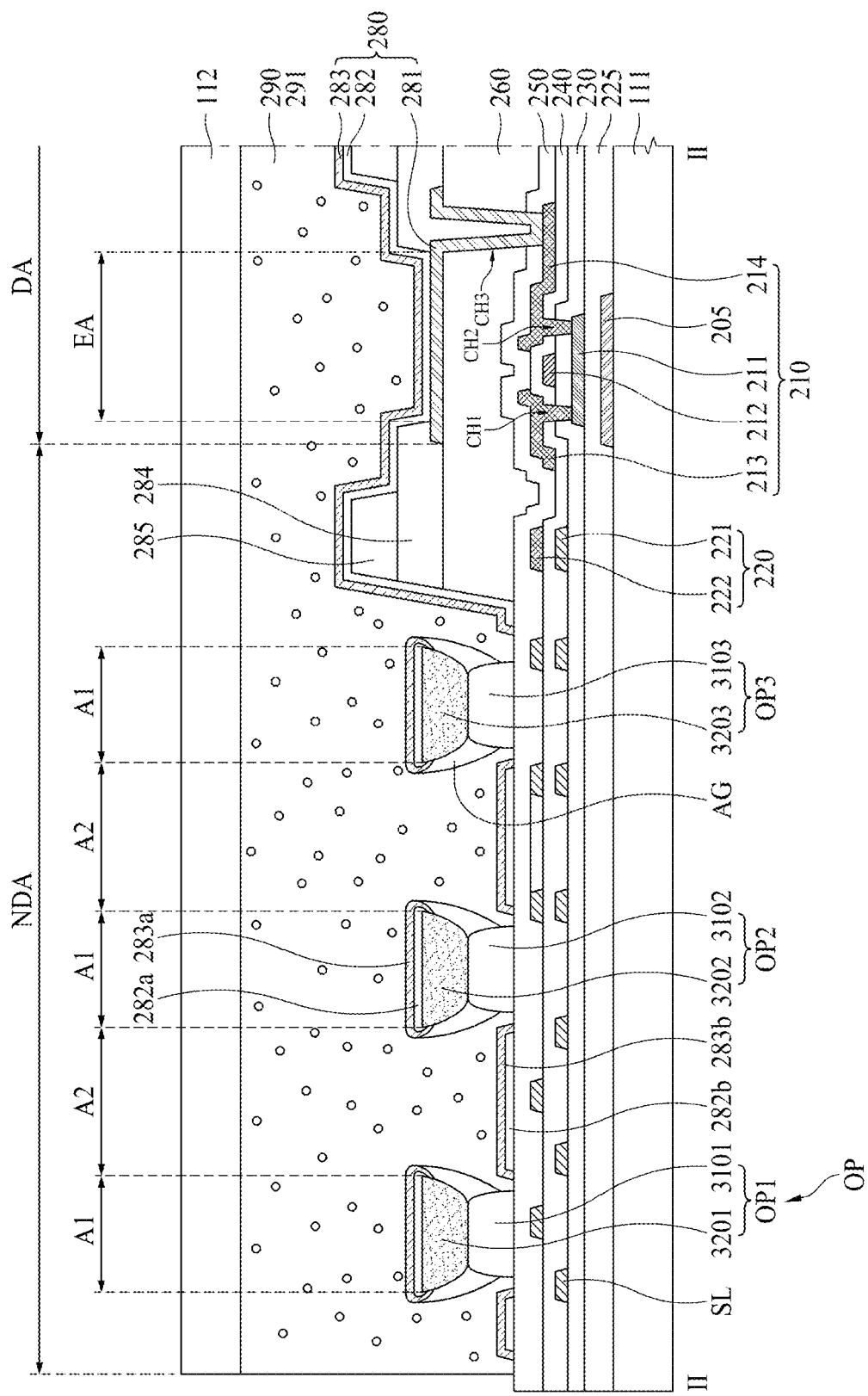
FIG. 5 is a schematic cross-sectional view taken along line II-II shown in FIG. 3.
Figure 6:
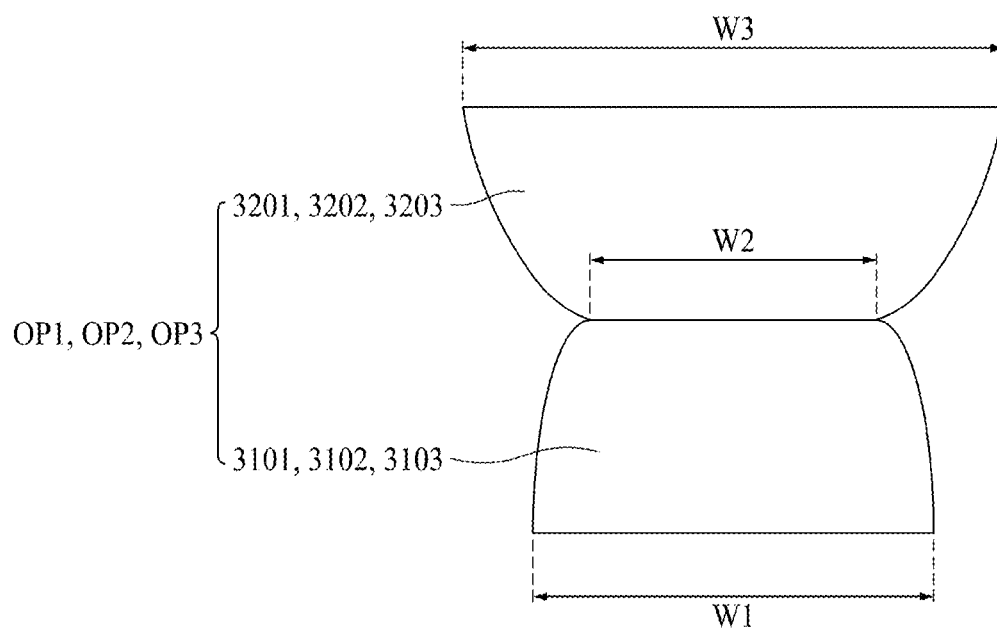
FIG. 6 is a cross-sectional view illustrating an organic pattern shown in FIG. 5.
Figure 7:
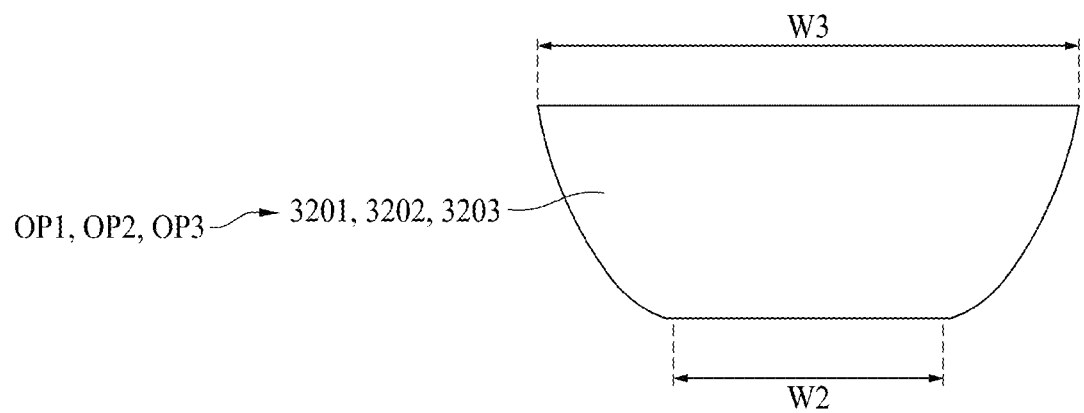
FIG. 7 is a cross-sectional view illustrating a modified example of an organic pattern shown in FIG. 5.
Figure 8:
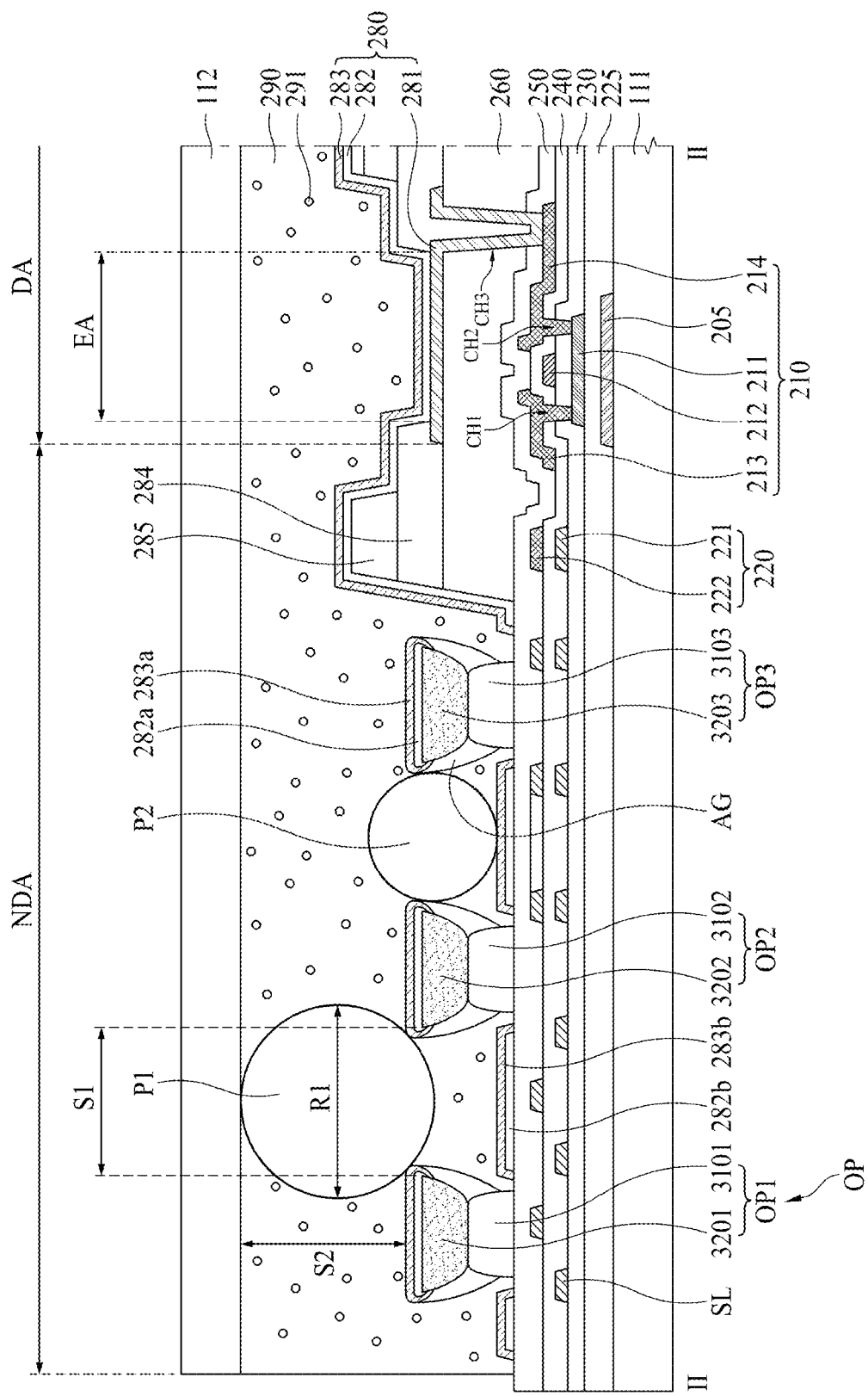
FIG. 8 is an exemplary cross-sectional view illustrating that particles enter the inside of a display panel.

FIG. 3 is a schematic plane view illustrating a display panel according to one embodiment of the present disclosure, FIG. 4 is a cross-sectional view illustrating an example of a pixel of a display area of FIG. 3, FIG. 5 is a schematic cross-sectional view taken along line II-II shown in FIG. 3, FIG. 6 is a cross-sectional view illustrating an organic pattern shown in FIG. 5, FIG. 7 is a cross-sectional view illustrating a modified example of an organic pattern shown in FIG. 5, and FIG. 8 is an exemplary cross-sectional view illustrating that particles enter the inside of a display panel.

Referring to FIG. 3, the display panel 110 is categorized into a display area DA and a non-display area NDA. Pixels P for displaying images are provided in the display area DA. Each of the pixels may include a light emitting diode that includes a TFT, a first electrode, a light emitting layer, and a second electrode. Each of the pixels supplies a predetermined current to the light emitting diode in accordance with a data voltage of a data line if a gate signal is input from a gate line by using a TFT. For this reason, the light emitting diode of each of the pixels may emit light with a predetermined brightness in accordance with the predetermined current.

Hereinafter, a structure of the pixel P of the display area DA according to the embodiments of the present disclosure will be described in detail with reference to FIG. 4.

Referring to FIG. 4, thin film transistors (TFTs) 210 and capacitors 220 are provided over one surface of the first substrate 111 facing the second substrate 112.

A buffer layer may be provided over the first substrate 111 to protect the TFTs 210 from moisture penetrating through the first substrate 111 which is susceptible to moisture transmission.

Each of the TFTs 210 includes an active layer 211, a gate electrode 212, a source electrode 213, and a drain electrode 214. In FIG. 4, the TFTs 210 are formed according to a top gate scheme in which the gate electrode 212 of each of the TFTs 210 is provided above the active layer 211 is illustrated but it should be appreciated that the present disclosure is not limited thereto. That is, the TFTs 210 may be formed according to a bottom gate scheme in which the gate electrode 212 is located below the active layer 211 or according to a double gate scheme in which the gate electrode 212 is provided above and below the active layer 211.

An active layer 211 is provided over the buffer layer of the first substrate 111. The active layer 211 may be formed of a silicon-based semiconductor material or an oxide-based semiconductor material. A light blocking layer 205 for blocking ambient light incident over the active layer 211 may be provided between the first substrate 111 and the active layer 211. The light blocking layer 205 may be formed of a metal material. An insulating layer 225 for insulating the active layer 211 and the light blocking layer 205 may be provided between the active layer 211 and the light blocking layer 205. The light blocking layer 205 and the insulating layer 225 may be omitted A gate insulating layer 230 may be provided over the active layer 211. The gate insulating layer 230 may be formed of an inorganic layer, e.g., a silicon oxide layer, a silicon nitride layer, or a multi-layer thereof.

The gate electrode 212 may be provided over the gate insulating layer 230. The gate electrode 212 may be a single layer or a multi-layer formed of any one of molybdenum (Mo), aluminum (Al), chromium (Cr), gold (Au), titanium (Ti), nickel (Ni), neodymium (Nd), and copper (Cu), or an alloy thereof but it is not limited thereto.

An interlayer insulating layer 240 may be provided over the gate electrode 212. The interlayer insulating layer 240 may be formed of an inorganic layer, e.g., a silicon oxide layer, a silicon nitride layer, or a multi-layer thereof.

A source electrode 213 and a drain electrode 214 may be provided over the interlayer insulating layer 240. The source electrode 213 and the drain electrode 214 may be connected to the active layer 211 through contact holes CH1 and CH2 penetrating through the gate insulating layer 230 and the interlayer insulating layer 240. Each of the source electrode 213 and the drain electrode 214 may be formed of a metal such as molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

Each of the capacitors 220 includes a lower electrode 221 and an upper electrode 222. The lower electrode 221 is provided over the gate insulating layer 230 and may be formed of the same material as that of the gate electrode 212. The upper electrode 222 may be provided over the interlayer insulating layer 240 and may be formed of the same material as that of the source electrode 213 and the drain electrode 214.

A passivation layer 250 may be provided over the TFT 210 and the capacitor 220. The passivation layer 250 may serve as an insulating layer. The passivation layer 250 may be formed of an inorganic layer, e.g., a silicon oxide layer, a silicon nitride layer, or a multi-layer thereof. The passivation layer may be omitted.

A planarization film 260 may be provided over the passivation layer 250 to smooth a step due to the TFT 210 and the capacitor 220. The planarization film 260 may be formed of an organic layer such as an acrylic resin, an epoxy resin, a phenolic resin, a polyamide resin, or a polyimide resin.

A light emitting diode 280, a bank 284, and a spacer 285 may be provided over a planarization film 260. The light emitting diode 280 includes a first electrode 281, a light emitting layer 282, and a second electrode 283. The first electrode 281 may be an anode electrode, and the second electrode 283 may be a cathode electrode. An area where the first electrode 281, the light emitting layer 282, and the second electrode 283 are deposited may be defined as a light emission area EA.

The first electrode 281 may be provided over the planarization film 260. The first electrode 281 is connected to any one of a source electrode 213 and a drain electrode 214 of the TFT 210 through a contact hole CH3 that passes through a passivation film 250 and the planarization film 260.

The first electrode 281 may be formed of a transparent metal material, a semi-transmissive metal material, or a metal material with high reflectance. If the display device 100 is formed in the top emission type, the first electrode 281 may be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), copper, (Cu), and etc. If the display device 100 is formed in the bottom emission type, the first electrode 281 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). The first electrode 281 may be the anode electrode.

The bank 284 may be provided to cover an end of each first electrode 281 for defining an emission area EA. The spacer 285 may be provided over the bank 284. The spacer 285 may have a width equal to or less than the width of the bank 284. The bank 284 and the spacer 285 may be formed of an organic layer such as acryl resin, epoxy resin, phenolic resin, polyamide resin, polyimide resin, or the like A light emitting layer 282 is provided over the first electrode 281, the bank 284, and the spacer 285. The light emitting layer 282 may include a hole transporting layer, at least one light emitting layer, and an electron transporting layer. In this case, when a voltage is applied to the first electrode 281 and the second electrode 283, holes and electrons move to the light emitting layer through the hole transporting layer and the electron transporting layer, respectively, and are combined with each other in the light emitting layer to emit light.

The light emitting layer 282 may be a white light emitting layer that emits white light. In this case, the light emitting layer 282 may be a common layer commonly provided for subpixels P1, P2 and P3, and may be provided to overlay the first electrode 281, the bank 284 and the spacer 285. A color filter (not shown) may be provided over the second substrate 112.

If the light emitting layer 282 is a white light emitting layer, the light emitting layer 282 may be provided with a tandem structure of two or more stacks. Each of the stacks may include a hole transporting layer, at least one light emitting layer, and an electron transporting layer.

A charge generating layer may be provided between the stacks. The charge generating layer may include an n-type charge generating layer positioned adjacent to a lower stack, and a p-type charge generating layer provided on the n-type charge generating layer and positioned adjacent to an upper stack. The n-type charge generating layer injects the electron to the lower stack, and the p-type charge generating layer injects the hole to the upper stack. The n-type charge generating layer may be formed by doping an organic host material having an electron transporting capacity with alkali-based metal such as lithium (Li), natrium (Na), kalium (K) or cesium (Cs), or alkali earth metal such as magnesium (Mg), strontium (Sr), barium (Ba) or radium (Ra), but not limited to these materials. The P-type charge generating layer may be formed by doping an organic host material having a hole transporting capacity with dopant.

Alternatively, the light emitting layer 282 may include a red light emitting layer emitting red light, a green light emitting layer emitting green light, and a blue light emitting layer emitting blue light. The red light emitting layer, the green light emitting layer and the blue light emitting layer may be provided to be patterned per subpixel over the first electrode 281. For example, the red light emitting layer may be provided to be patterned in one subpixel, the green light emitting layer may be provided to be patterned in another subpixel, and the blue light emitting layer may be provided to be patterned in the other subpixel, but may not be limited thereto. In this case, a color filter may not be provided over the second substrate 112.

The second electrode 283 is provided over the light emitting layer 282. The second electrode 283 may be formed of a transparent metal material, a semi-transmissive metal material, or a metal material with high reflectance. If the display device 100 is formed in the top emission type, the second electrode 283 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). If the display device 100 is formed in the bottom emission type, the second electrode 283 may be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), copper, (Cu), and etc. The second electrode 283 may be a cathode electrode. A capping layer (not shown) may be provided over the second electrode 283.

First to third color filters (not shown) and a black matrix (not shown) may be provided over the second substrate 112. A red color filter may be provided in a red light emission area, a blue color filter may be provided in a blue light emission area, and a green color filter may be provided in a green light emission area.

An adhesive layer 290 may be provided between the first substrate 111 and the second substrate 112, which are provided with the light emitting diode 280, and may adhere the first substrate 111 to the second substrate 112. The adhesive layer 290 may include a transparent adhesive resin 291, and a water absorption material 292 distributed in the transparent adhesive resin 291. For example, the water absorption material 292 may be a getter.

The adhesive layer 290 is provided in an entire area that includes the display area DA and the non-display area NDA, and prevents water entering the inside of the display panel 110 from being permeated into the light emitting diode 280.

The adhesive layer 290 according to one embodiment of the present disclosure includes an adhesive resin 291, and serves to adhere the first substrate 111 and the second substrate 112 to each other. At the same time, the adhesive layer 290 according to one embodiment of the present disclosure may include a water absorption material 292, and may have an encapsulation function of preventing water entering the inside of the display panel 110 from being permeated into the light emitting diode 280.

In the display panel 110 according to one embodiment of the present disclosure, since the adhesive layer 290 has an encapsulation function, a separate encapsulation film may not be provided over the light emitting diode 280. Therefore, a thickness of the display panel 110 according to one embodiment of the present disclosure may be reduced.

Also, in the display panel 110 according to one embodiment of the present disclosure, a design margin of the encapsulation film in the non-display area may not be considered. In detail, the encapsulation film may generally include at least one inorganic film and at least one organic film. The inorganic film constituting the encapsulation film may be provided to overlay the light emitting diode 280. At this time, the inorganic film may be deposited by a Chemical Vapor Deposition (CVD) method or an Atomic Layer Deposition (ALD) method. Since the inorganic film deposited by the CVD or ALD method has good step coverage, a sufficient margin should be considered such that the inorganic film may not be formed to reach an end of the display panel 110.

Also, the organic film constituting the encapsulation film has flexibility. In the general display panel 110, an element for blocking a flow of the organic film constituting the encapsulation film, for example, a dam should be provided in the non-display area NDA. Therefore, a design margin for forming a dam is required for the non-display area NDA.

The display panel 110 according to one embodiment of the present disclosure does not need to consider a design margin of the inorganic film constituting the encapsulation film in the non-display area NDA and a design margin of a dam because the encapsulation film is not provided. Therefore, the display panel 110 according to one embodiment of the present disclosure may reduce a width between the display area DA and the end, that is, a width of the non-display area NDA.

Referring to FIG. 3 again, a pad area PA where pads are provided may be included in the non-display area NDA. The pad area PA may be disposed at an edge over one side of the display panel 110. The pad area PA may include a plurality of pads, and the plurality of pads may electrically be connected to lines of a flexible film 150 by an anisotropic conducting film.

Also, a plurality signal lines connected to the pixels P provided in the display area DA or a plurality of pads are disposed in the non-display area NDA. The plurality of signal lines may provide a signal, voltage, power, etc. for driving the pixels P to the pixels P. For example, the plurality of signal lines may include a power line for delivering a power supplied through a pad to the pixel P. For another example, the plurality of signal lines may include a gate driver for supplying a gate signal to gate lines.

The display panel 110 according to one embodiment of the present disclosure includes a plurality of organic patterns OP provided in the non-display area NDA. The plurality of organic patterns OP may be provided over the plurality of signal lines to prevent the plurality of signal lines from being damaged by particles entering the inside of the display panel 110.

Hereinafter, the plurality of organic patterns OP according to one embodiment of the present disclosure will be described in detail with reference to FIGS. 5 to 8.

Referring to FIGS. 5 to 8, the display panel 110 according to one embodiment of the present disclosure is categorized into the display area DA and the non-display area NDA. The display area DA is provided with a pixel P comprised of a TFT 210, a capacitor 220, and a light emitting diode 280. A plurality of signal lines SL and a plurality of organic patterns OP are provided in the non-display area NDA.

The plurality of signal lines SL are connected with the pixel P and provide signal, voltage, power, etc. for driving the pixel P. Each of the plurality of signal lines SL may be provided over the same layer as any one of a light shielding layer 205, a gate electrode 212, a source electrode 213 and a drain electrode 214 of the display area DA. Each of the plurality of signal lines SL may be made of the same material as that of any one of the light shielding layer 205, the gate electrode 212, the source electrode 213 and the drain electrode 214 of the display area DA.

The plurality of organic patterns OP are provided over the plurality of signal lines SL in the non-display area NDA. The plurality of organic patterns OP may include a first organic pattern OP1, a second organic pattern OP2 and a third organic pattern OP3, which are spaced apart from one another at a predetermined interval.

Although FIGS. 3, 5 and 8 show that the display panel 110 includes three organic patterns OP1, OP2 and OP3, the present disclosure is not limited to the examples of FIGS. 3, 5 and 8. The display panel 110 according to one embodiment of the present disclosure may include two or more organic patterns OP, and a spaced distance between the organic patterns OP and the number of the organic patterns OP may be varied depending on a width of the non-display area NDA and a thickness of the adhesive layer 290.

Hereinafter, for convenience of description, a description will be given based on that the display panel 110 includes three organic patterns OP1, OP2 and OP3.

The third organic pattern OP3 is provided over a plurality of signal lines SL. The third organic pattern OP3 prevents the plurality of signal lines SL of the non-display area NDA from being damaged by particles entering the inside of the display panel 110.

Various sized particles may enter the inside of the display panel 110. At this time, the plurality of lines disposed inside the display panel 110 may be damaged by the particles entering the inside of the display panel 110. Particularly, inorganic films are only provided in the non-display area NDA without organic films to block propagation of water or oxygen. The plurality of lines SL may be protected by only the inorganic films having a low impact absorption rate and a thin thickness in the non-display area NDA. If a pressure is applied to the display panel 110, particles may be permeated into the non-display area NDA by passing through the inorganic films, thereby easily damaging the plurality of lines SL provided in the non-display area NDA.

In order to solve the above problem, in the display panel 110 according to one embodiment of the present disclosure, the third organic pattern OP3 is provided over the plurality of signal lines SL of the non-display area NDA. The third organic pattern OP3 may be made of an organic material having an impact absorption rate better than that of an inorganic material to absorb the pressure applied to the particles. Therefore, the third organic pattern OP3 may reduce the pressure delivered to the plurality of signal lines SL. Also, the third organic pattern OP3 may be provided at a thickness enough to prevent the plurality of lines SL from being damaged by particles even though the pressure is applied thereto.

The third organic pattern OP3 is provided to be spaced apart from the organic films provided in the display area DA. In detail, the third organic pattern OP3 may be spaced apart from the planarization film 260, the bank 284, and the spacer 285, which are extended from the display area DA. The planarization film 260, the bank 284, and the spacer 285, which are extended from the third organic pattern OP3 and the display area DA, may be made of an organic material vulnerable to water and oxygen. The display panel 110 according to one embodiment of the present disclosure may prevent water or oxygen from being permeated into the display area DA through the third organic pattern OP3 by spacing the third organic pattern OP3 apart from the organic films provided in the display area DA.

The third organic pattern OP3, as shown in FIG. 3, is formed in a shape of line surrounding the display area DA.

The third organic pattern OP3 may have a two-layered structure that includes a first layer 3103 and a second layer 3203, as shown in FIGS. 5 and 6. In this case, each of the first layer 3103 and the second layer 3203 of the third organic pattern OP3 may be formed of the same material as that of any one of the planarization film 260, the bank 284 and the spacer 285 of the display area DA. For example, the first layer 3103 of the third organic pattern OP3 may be formed of the same material as that of the bank 284 of the display area DA simultaneously with the bank 284, and the second layer 3203 of the third organic pattern OP3 may be formed of the same material as that of the spacer 285 of the display area DA simultaneously with the spacer 285. For another example, the first layer 3103 of the third organic pattern OP3 may be formed of the same material as that of the planarization film 260 of the display area DA simultaneously with the planarization film 260, and the second layer 3203 of the third organic pattern OP3 may be formed of the same material as that of the bank 284 of the display area DA simultaneously with the bank 284.

The third organic pattern OP3, as shown in FIGS. 5 and 6, may have an undercut structure in which a width of the second layer 3203 is wider than that of the first layer 3103. That is, the third organic pattern OP3 may be an undercut organic pattern.

In detail, the first layer 3103 of the third organic pattern OP3 may have a forward tapered structure in which a width W1 of a lower surface is wider than a width W2 of an upper surface. The second layer 3203 of the third organic pattern OP3 may have an inverse tapered structure in which a width W2 of a lower surface is narrower than a width W3 of an upper surface. The lower surface of the second layer 3203 adjoins the upper surface of the first layer 3103 and thus has the same width as the width W2 of the upper surface of the first layer 3103. The third organic pattern OP3 may have an undercut structure in which a width W3 of the upper surface of the second layer 3203 is wider than the width W1 of the lower surface of the first layer 3103.

Although FIGS. 5 and 6 show that the third organic pattern OP3 has a two-layered structure, the present disclosure is not limited to the examples of FIGS. 5 and 6. In another embodiment, the third organic pattern OP3, as shown in FIG. 7, may have a single layered structure that includes a second layer 3203 only. In this case, the third organic pattern OP3 may have an inverse tapered structure in which a width W2 of a lower surface is narrower than a width W3 of an upper surface.

In the display panel 110 according to one embodiment of the present disclosure, the light emitting layer 282 and the second electrode 283 of the light emitting diode 280 are provided even in the non-display area NDA as well as the display area DA. At this time, the light emitting layer 282 and the second electrode 283 of the light emitting diode 280 may be short-circuited by the third organic pattern OP3.

In detail, the third organic pattern OP3 is provided to be spaced apart from the organic films provided in the display area DA, for example, the planarization film 260, the bank 284 and the spacer 285. Therefore, sides of the planarization film 260, the bank 284 and the spacer 285, which are provided in the display area DA, are exposed between the display area DA and the third organic pattern OP3. The light emitting layer 282 and the second electrode 283 provided in the display area DA may be extended to the non-display area NDA, and may be provided along the sides of the planarization film 260, the bank 284 and the spacer 285, which are exposed from the non-display area NDA.

Also, the light emitting layer 282 and the second electrode 283 are also provided over the third organic pattern OP3 provided in the non-display area NDA. At this time, the light emitting layer 282 and the second electrode 283 may be short-circuited by the third organic pattern OP3 having an undercut structure as shown in FIG. 6. Alternatively, the light emitting layer 282 and the second electrode 283 may be short-circuited by the third organic pattern OP3 having an inverse tapered structure as shown in FIG. 7. If the third organic pattern OP3 has an inverse tapered structure as shown in FIG. 7, short-circuit of the light emitting layer 282 and the second electrode 283 may be varied depending on a tapered angle. Since the tapered angle may be varied depending on a processor error, the light emitting layer 282 and the second electrode 283 may not be short-circuited. On the other hand, if the third organic pattern OP3 has an undercut structure as shown in FIG. 6, short-circuit of the light emitting layer 282 and the second electrode 283 may be ensured.

Consequently, the light emitting layer 282 extended from the display area DA is disposed to be spaced apart from the light emitting layer 282 provided over the third organic pattern OP3. The second electrode 283 extended from the display area DA is disposed to be spaced apart from the second electrode 283 provided over the third organic pattern OP3.

Therefore, even though water or oxygen enters the light emitting layer 282 or the second electrode 283 provided over the third organic pattern OP3, water or oxygen may be prevented from being propagated into the light emitting layer 282 or the second electrode 283 provided in the display area DA through the light emitting layer 282 or the second electrode 283 provided over the third organic pattern OP3.

The second organic pattern OP2 and the first organic pattern OP1 are provided over the plurality of signal lines SL. The second organic pattern OP2 and the first organic pattern OP1 are prevent the plurality of signal lines SL of the non-display area NDA from being damaged by particles entering the inside of the display panel 110, together with the third organic pattern OP3.

The first organic pattern OP1 and the second organic pattern OP2 may be made of an organic material having a good impact absorption rate in the same manner as the third organic pattern OP3 and thus may absorb a pressure applied by particles. Therefore, the first organic pattern OP1 and the second organic pattern OP2 may reduce the pressure delivered to the plurality of signal lines SL. Also, the first organic pattern OP1 and the second organic pattern OP2 may be provided at a thickness enough to prevent the plurality of lines SL from being damaged by particles even though the pressure is applied thereto.

The second organic pattern OP2 is spaced apart from the third organic pattern OP3, and thus, as shown in FIG. 3, may be formed in a shape of line surrounding the third organic pattern OP3. The first organic pattern OP1 is spaced apart from the second organic pattern OP2, and thus, as shown in FIG. 3, may be formed in a shape of line surrounding the second organic pattern OP2.

In the display panel 110 according to one embodiment of the present disclosure, the first organic pattern OP1, the second organic pattern OP2 and the third organic pattern OP3 are disposed to be spaced apart from one another. Therefore, the display panel 110 according to one embodiment of the present disclosure may prevent water or oxygen entering the first organic pattern OP1 from being permeated into the second organic pattern OP2. Also, the display panel 110 according to one embodiment of the present disclosure may prevent water or oxygen entering the second organic pattern OP2 from being permeated into the third organic pattern OP3. As a result, the display panel 110 according to one embodiment of the present disclosure may prevent water from being propagated through the organic patterns OP1, OP2 and OP3 even though the organic patterns OP1, OP2 and OP3 are provided in the non-display area NDA.

Meanwhile, spaced distances S1 among the first organic pattern OP1, the second organic pattern OP2 and the third organic pattern OP3 may be varied depending on the thickness of the adhesive layer 290. In this case, the spaced distances S1 may indicate distances among upper surfaces of the organic patterns OP1, OP2 and OP3. For example, the spaced distance S1 indicates a distance between one end over an upper surface of the first organic pattern OP1 and one end over an upper surface of the second organic pattern OP2. At this time, one end of the upper surface of the second organic pattern OP2 is an edge that faces one end of the upper surface of the first organic pattern OP1.

In detail, the spaced distances S1 among the first organic pattern OP1, the second organic pattern OP2 and the third organic pattern OP3 are shorter than a distance S2 from the upper surface of the second electrode 283 provided over the organic patterns OP1, OP2 and OP3 to the upper surface of the adhesive layer 290.

The spaced distances S1 among the first organic pattern OP1, the second organic pattern OP2 and the third organic pattern OP3 may be equal to or different from one another. For example, the spaced distance between the first organic pattern OP1 and the second organic pattern OP2 and the spaced distance between the second organic pattern OP2 and the third organic pattern OP3 may be equal to or different from each other. Even in the case that the spaced distances are different from each other, the spaced distance between the first organic pattern OP1 and the second organic pattern OP2 and the spaced distance between the second organic pattern OP2 and the third organic pattern OP3 should be shorter than the distance S2 from the upper surface of the second electrode 283 provided over the organic patterns OP1, OP2 and OP3 to the upper surface of the adhesive layer 290.

Various sized particles may enter the inside of the display panel 110 as shown in FIG. 8. If a pressure is applied to a first particle P1 which is great in size, the first particle P1 may reach the plurality of signal lines SL by passing through the adhesive layer 290. On the other hand, even though a pressure is applied to a second particle P2 which is smaller, the second particle P2 fails to pass through the adhesive layer 290, thereby failing to reach the plurality of signal lines SL.

The display panel 110 according to one embodiment of the present disclosure may allow the first particle P1 which is great in size not to reach the plurality of signal lines SL by controlling the spaced distances S1 among the first organic pattern OP1, the second organic pattern OP2 and the third organic pattern OP3. To this end, the display panel 110 according to one embodiment of the present disclosure may be provided to allow the spaced distances S1 among the first organic pattern OP1, the second organic pattern OP2 and the third organic pattern OP3 to be shorter than the distance S2 from the upper surface of the second electrode 283 provided over the organic patterns OP1, OP2 and OP3 to the upper surface of the adhesive layer 290.

The first particle P1 having a first diameter R1 greater than the spaced distance S1 among the first organic pattern OP1, the second organic pattern OP2 and the third organic pattern OP3 fails to enter areas among the organic patterns OP1, OP2 and OP3.

The first particle P1 cannot reach the plurality of signal lines SL over the organic patterns OP1, OP2 and OP3 due to the organic patterns OP1, OP2 and OP3. Also, since the first particle P1 has the first diameter R1 greater than the spaced distance S1 among the organic patterns OP1, OP2 and OP3, the first particle P1 fails to enter areas among the organic patterns OP1, OP2 and OP3. Therefore, the first particle P1 cannot reach the plurality of signal lines SL among the organic patterns OP1, OP2 and OP3.

Consequently, since the first particle P1 which is great in size cannot reach the plurality of signal lines SL by passing through the adhesive layer 290, the plurality of signal lines SL may be prevented from being damaged.

Meanwhile, the first organic pattern OP1 may have a two-layered structure that includes a first layer 3101 and a second layer 3201, as shown in FIGS. 5 and 6. In this case, each of the first layer 3101 and the second layer 3201 of the first organic pattern OP1 may be formed of the same material as that of any one of the planarization film 260, the bank 284 and the spacer 285 of the display area DA. The second organic pattern OP2 may have a two-layered structure that includes a first layer 3102 and a second layer 3202, as shown in FIGS. 5 and 6. In this case, each of the first layer 3102 and the second layer 3202 of the second organic pattern OP2 may be formed of the same material as that of any one of the planarization film 260, the bank 284 and the spacer 285 of the display area DA.

For example, the first layer 3101 of the first organic pattern OP1 and the first layer 3102 of the second organic pattern OP2 may be formed of the same material as that of the bank 284 of the display area DA simultaneously with the bank 284. The second layer 3201 of the first organic pattern OP1 and the second layer 3202 of the second organic pattern OP2 may be formed of the same material as that of the spacer 285 of the display area DA simultaneously with the spacer 285.

For another example, the first layer 3101 of the first organic pattern OP1 and the first layer 3102 of the second organic pattern OP2 may be formed of the same material as that of the planarization film 260 of the display area DA simultaneously with the planarization film 260. The second layer 3201 of the first organic pattern OP1 and the second layer 3202 of the second organic pattern OP2 may be formed of the same material as that of the bank 284 of the display area DA simultaneously with the bank 284.

The first organic pattern OP1, as shown in FIGS. 5 and 6, may have an undercut structure in which a width of the second layer 3201 is wider than that of the first layer 3101. The second organic pattern OP2, as shown in FIGS. 5 and 6, may have an undercut structure in which a width of the second layer 3202 is wider than that of the first layer 3102. That is, the first organic pattern OP1 and the second organic pattern OP2 may be an undercut organic pattern in the same manner as the third organic pattern OP3.

Since the undercut structure of each of the first organic pattern OP1 and the second organic pattern OP2 is substantially the same as that of the third organic pattern OP3, its detailed description will be omitted.

In the display panel 110 according to one embodiment of the present disclosure, the light emitting layer 282 and the second electrode 283 of the light emitting diode 280 are provided even in the non-display area NDA as well as the display area DA. At this time, the light emitting layer 282 and the second electrode 283 of the light emitting diode 280 may be short-circuited by the first organic pattern OP1, the second organic pattern OP2 and the third organic pattern OP3.

In detail, the non-display area NDA, as shown in FIG. 5 includes a first area A1 provided with the first organic pattern OP1, the second organic pattern OP2 and the third organic pattern OP3, and a second area A2 provided among the first organic pattern OP1, the second organic pattern OP2 and the third organic pattern OP3.

The light emitting layer 282 and the second electrode 283 provided in the display area DA are extended to the non-display area NDA. The light emitting layer 282 and the second electrode 283 are provided over the first organic pattern OP1, the second organic pattern OP2 and the third organic pattern OP3 in the non-display area NDA. Since each of the first organic pattern OP1, the second organic pattern OP2 and the third organic pattern OP3 has an undercut structure as described above, the light emitting layer 282 and the second electrode 283 are short-circuited by the first organic pattern OP1, the second organic pattern OP2 and the third organic pattern OP3.

That is, a light emitting layer 282a provided in the first area A1 is disconnected from a light emitting layer 282b provided in the second area A2, and the light emitting layers 282a and 282b are spaced apart from each other. Therefore, even though water or oxygen enters the light emitting layer 282a provided in the first area A1, water or oxygen may be prevented from being propagated into the light emitting layer 282b provided in the second area A2.

Also, a second electrode 283a provided in the first area A1 is disconnected from a second electrode 283b provided in the second area A2, and the second electrodes 283a and 283b are spaced apart from each other. Therefore, even though water or oxygen enters the second electrode 283a provided in the first area A1, water or oxygen may be prevented from being propagated into the second electrode 283b provided in the second area A2.

Meanwhile, the second electrode 283b provided in the second area A2 may be provided to overlay the light emitting layer 282b provided in the second area A2. Also, the second electrode 283a provided in the first area A1 may be provided to overlay the light emitting layer 282a provided in the first area A1.

The display panel 110 according to one embodiment of the present disclosure may reduce exposure of the light emitting layer 282b to water by allowing the second electrode 283b made of a metal material to overlay the light emitting layer 282b made of an organic material vulnerable to water.

In the display panel 110 according to one embodiment of the present disclosure, the adhesive layer 290 includes an adhesive resin 291 and a water absorption material 292, and thus may have an adhesive function and an encapsulation function. Therefore, the display panel 110 according to one embodiment of the present disclosure may reduce its thickness and a width of the non-display area NDA because a separate encapsulation film is not provided.

The display panel 110 according to one embodiment of the present disclosure includes a plurality of organic patterns OP provided in the non-display area NDA. The plurality of organic patterns OP may be disposed over the plurality of signal lines SL to prevent the plurality of signal lines SL from being damaged by particles entering the inside of the display panel 110.

Also, the display panel 110 according to one embodiment of the present disclosure prevents water or oxygen from being delivered to the display area DA through the plurality of organic patterns OP by spacing the organic patterns OP apart from one another.

In this way, the display panel 110 according to one embodiment of the present disclosure may delay water permeation by increasing a path through which permeated water moves to the display area DA after organic materials provided in the non-display area NDA are provided to be patterned. Therefore, the display panel 110 according to one embodiment of the present disclosure may improve reliability.

Also, the display panel 110 according to one embodiment of the present disclosure may reduce the distance from the end to the display area DA, that is, a bezel area. Moreover, since the display panel 110 according to one embodiment of the present disclosure has water permeation prevention effect through the plurality of organic patterns OP, the first substrate 111 and the second substrate 112 may be bonded to each other by a side seal method. In this case, the display panel 110 according to one embodiment of the present disclosure may reduce a design margin for forming the adhesive layer 290 between the display areas DA at the end, and thus may minimize the bezel area.

Figure 9:
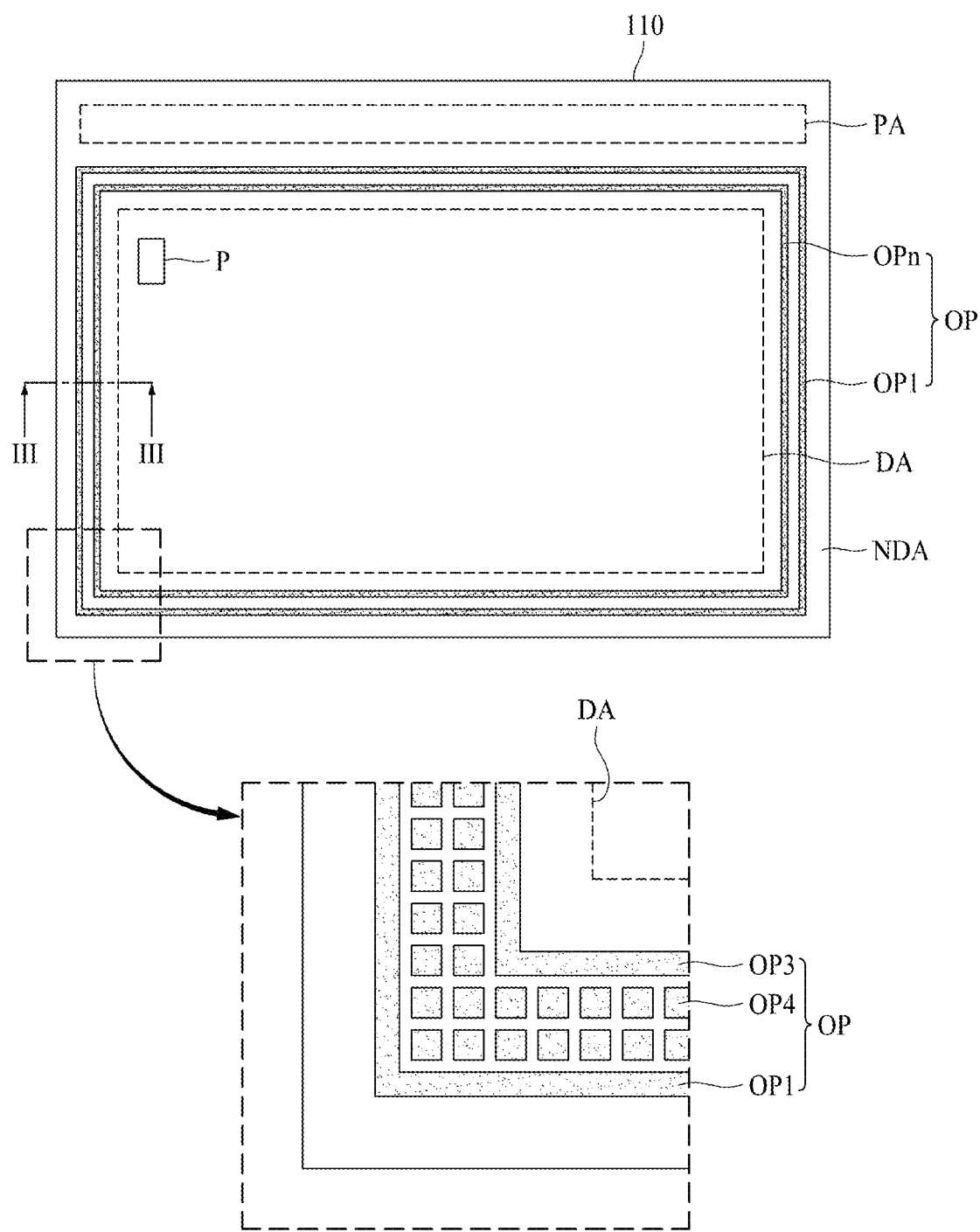
FIG. 9 is a schematic plane view illustrating a display panel according to another embodiment of the present disclosure.
Figure 10:
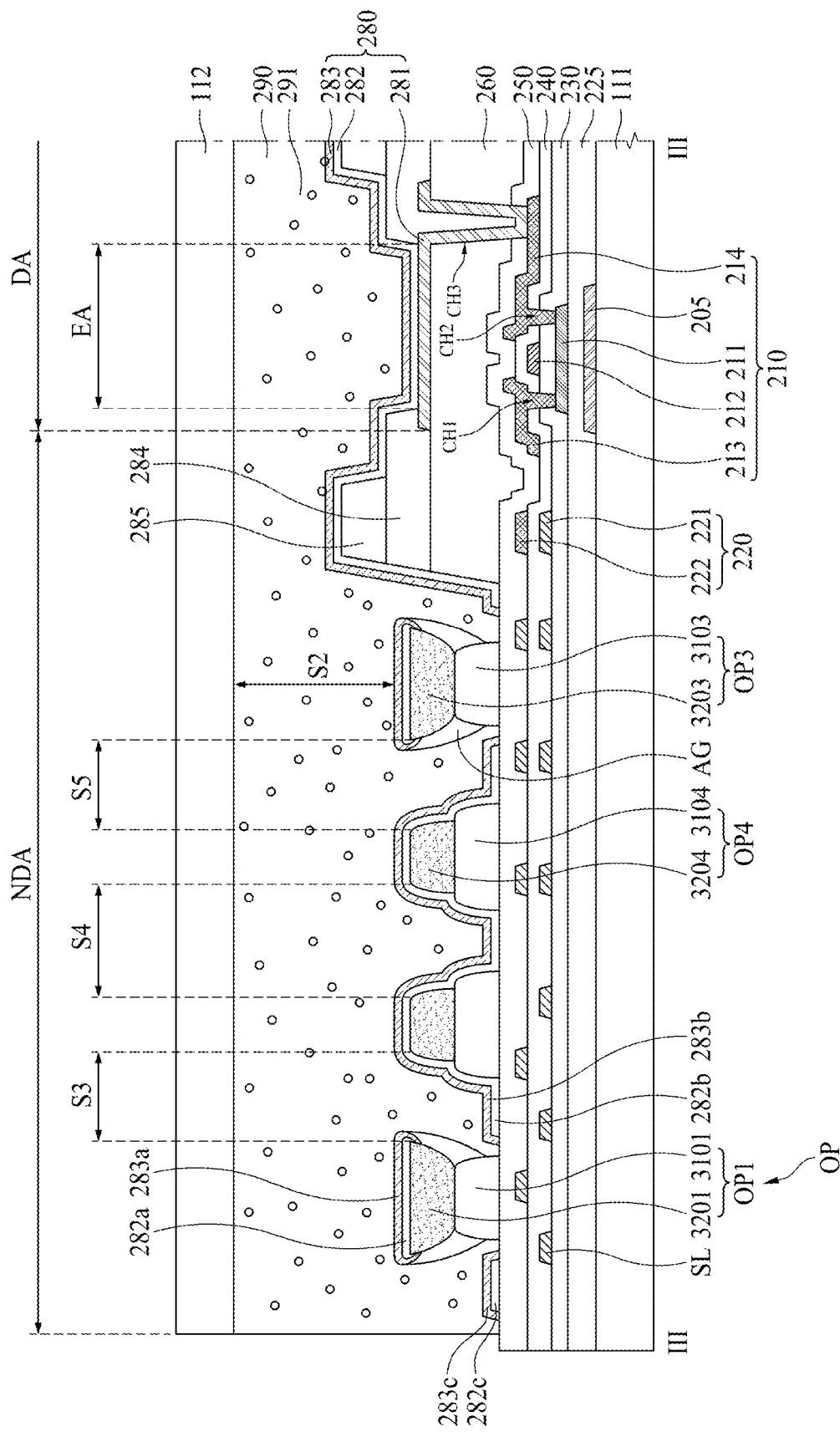
FIG. 10 is a schematic cross-sectional view taken along line shown in FIG. 9.
Figure 11:
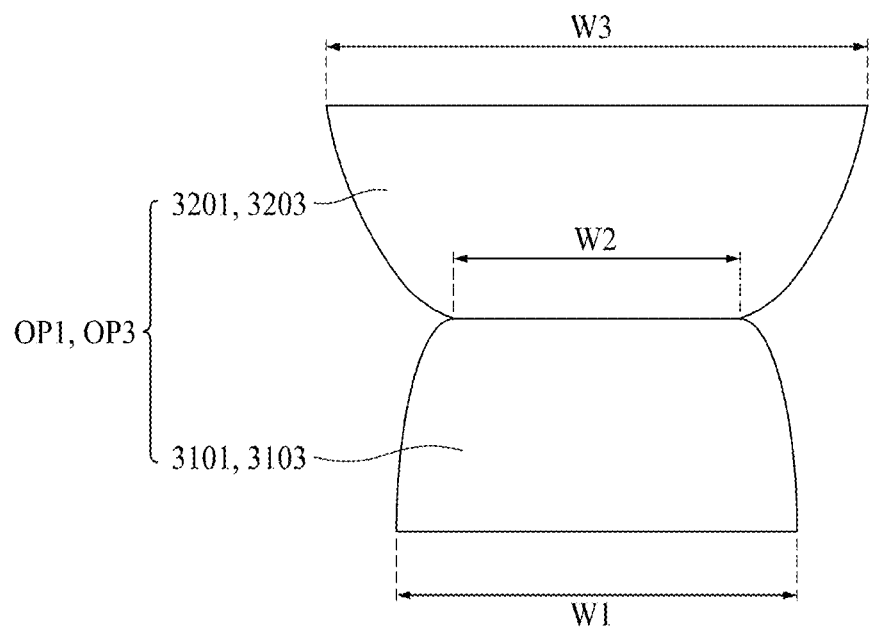
FIG. 11 is a cross-sectional view illustrating first and third organic patterns shown in FIG. 10.
Figure 12:
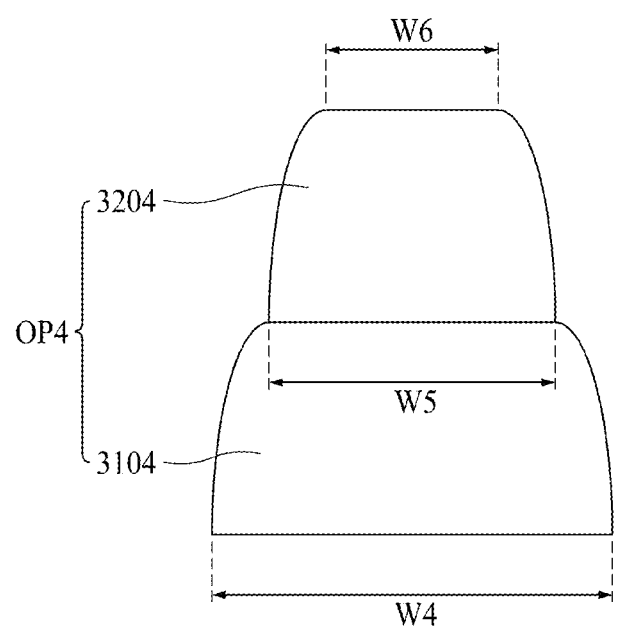
FIG. 12 is a cross-sectional view illustrating a fourth organic pattern shown in FIG. 10.
Figure 13:
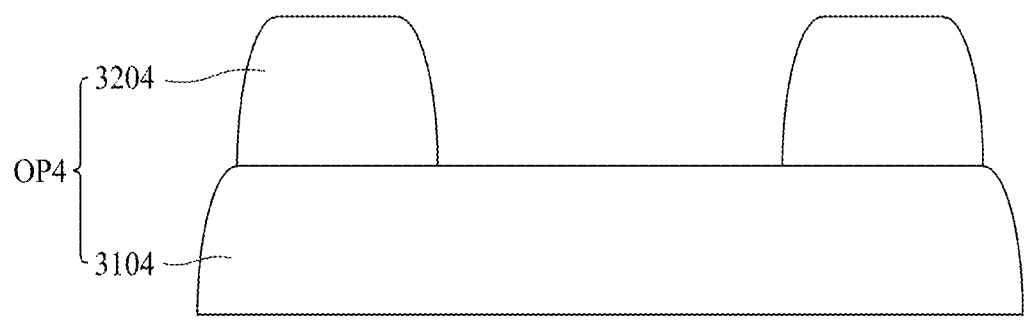
FIG. 13 is a cross-sectional view illustrating a modified example of a fourth organic pattern shown in FIG. 10.

FIG. 9 is a schematic plane view illustrating a display panel according to another embodiment of the present disclosure, FIG. 10 is a schematic cross-sectional view taken along line shown in FIG. 9, FIG. 11 is a cross-sectional view illustrating first and third organic patterns shown in FIG. 10, FIG. 12 is a cross-sectional view illustrating a fourth organic pattern shown in FIG. 10, and FIG. 13 is a cross-sectional view illustrating a modified example of a fourth organic pattern shown in FIG. 10.

The display panel 110 shown in FIGS. 9 to 13 is different from the display panel 110 shown in FIGS. 3 to 8 in structure and arrangement of the plurality of organic patterns OP. Since the display panel 110 shown in FIGS. 9 to 13 is substantially the same as the display panel 110 shown in FIGS. 3 to 8 except the plurality of organic patterns OP, its detailed description will be omitted.

Referring to FIG. 9, the display panel 110 according to another embodiment of the present disclosure includes the display area DA and the non-display area NDA. Pixels P displaying an image may be provided in the display area DA. The non-display area NDA may include a pad area PA The pad area PA may be disposed at an edge over one side of the display panel 110. The pad area PA may include a plurality of pads, and the plurality of pads may electrically be connected to lines of a flexible film 150 by an anisotropic conducting film.

Also, a plurality signal lines connected to the pixels P provided in the display area DA or a plurality of pads are disposed in the non-display area NDA. The plurality of signal lines may provide a signal, voltage, power, etc. for driving the pixels P to the pixels P. For example, the plurality of signal lines may include a power line for delivering a power supplied through a pad to the pixel P. For another example, the plurality of signal lines may include a gate driver for supplying a gate signal to gate lines.

The display panel 110 according to another embodiment of the present disclosure includes a plurality of organic patterns OP provided in the non-display area NDA. The plurality of organic patterns OP may be provided over the plurality of signal lines to prevent the plurality of signal lines from being damaged by particles entering the inside of the display panel 110.

Referring to FIGS. 10 to 13, the plurality of organic patterns OP are provided over the plurality of signal lines SL in the non-display area NDA. The plurality of organic patterns OP may include a first organic pattern OP1, a third organic pattern OP3 and a fourth organic pattern OP4, which are spaced apart from one another at a predetermined interval.

The third organic pattern OP3 is provided over a plurality of signal lines SL. The third organic pattern OP3 prevents the plurality of signal lines SL of the non-display area NDA from being damaged by particles entering the inside of the display panel 110.

Various sized particles may enter the inside of the display panel 110. At this time, the plurality of lines disposed inside the display panel 110 may be damaged by the particles entering the inside of the display panel 110. Particularly, inorganic films are only provided in the non-display area NDA without organic films to block propagation of water or oxygen. The plurality of lines SL may be protected by only the inorganic films having a low impact absorption rate and a thin thickness in the non-display area NDA. If a pressure is applied to the display panel 110, particles may be permeated into the non-display area NDA by passing through the inorganic films, thereby easily damaging the plurality of lines SL provided in the non-display area NDA.

In order to solve the above problem, in the display panel 110 according to another embodiment of the present disclosure, the third organic pattern OP3 is provided over the plurality of signal lines SL of the non-display area NDA. The third organic pattern OP3 may be made of an organic material having an impact absorption rate better than that of an inorganic material to absorb the pressure applied to the particles. Therefore, the third organic pattern OP3 may reduce the pressure delivered to the plurality of signal lines SL. Also, the third organic pattern OP3 may be provided at a thickness enough to prevent the plurality of lines SL from being damaged by particles even though the pressure is applied thereto.

The third organic pattern OP3 is provided to be spaced apart from the organic films provided in the display area DA. In detail, the third organic pattern OP3 may be spaced apart from the planarization film 260, the bank 284, and the spacer 285, which are extended from the display area DA. The planarization film 260, the bank 284, and the spacer 285, which are extended from the third organic pattern OP3 and the display area DA, may be made of an organic material vulnerable to water and oxygen. The display panel 110 according to one embodiment of the present disclosure may prevent water or oxygen from being permeated into the display area DA through the third organic pattern OP3 by spacing the third organic pattern OP3 apart from the organic films provided in the display area DA.

The third organic pattern OP3, as shown in FIG. 3, is formed in a shape of line surrounding the display area DA.

The third organic pattern OP3 may have a two-layered structure that includes a first layer 3103 and a second layer 3203, as shown in FIGS. 10 and 11. In this case, each of the first layer 3103 and the second layer 3203 of the third organic pattern OP3 may be formed of the same material as that of any one of the planarization film 260, the bank 284 and the spacer 285 of the display area DA. For example, the first layer 3103 of the third organic pattern OP3 may be formed of the same material as that of the bank 284 of the display area DA simultaneously with the bank 284, and the second layer 3203 of the third organic pattern OP3 may be formed of the same material as that of the spacer 285 of the display area DA simultaneously with the spacer 285. For another example, the first layer 3103 of the third organic pattern OP3 may be formed of the same material as that of the planarization film 260 of the display area DA simultaneously with the planarization film 260, and the second layer 3203 of the third organic pattern OP3 may be formed of the same material as that of the bank 284 of the display area DA simultaneously with the bank 284.

The third organic pattern OP3, as shown in FIGS. 10 and 11, may have an undercut structure in which a width of the second layer 3203 is wider than that of the first layer 3103. That is, the third organic pattern OP3 may be an undercut organic pattern.

In detail, the first layer 3103 of the third organic pattern OP3 may have a forward tapered structure in which a width W1 of a lower surface is wider than a width W2 of an upper surface. The second layer 3203 of the third organic pattern OP3 may have an inverse tapered structure in which a width W2 of a lower surface is narrower than a width W3 of an upper surface. The lower surface of the second layer 3203 adjoins the upper surface of the first layer 3103 and thus has the same width as the width W2 of the upper surface of the first layer 3103. The third organic pattern OP3 may have an undercut structure in which a width W3 of the upper surface of the second layer 3203 is wider than the width W1 of the lower surface of the first layer 3103.

Although FIGS. 10 and 11 show that the third organic pattern OP3 has a two-layered structure, the present disclosure is not limited to the examples of FIGS. 10 and 11. In another embodiment, the third organic pattern OP3 may have a single layered structure that includes a second layer 3203 only. In this case, the third organic pattern OP3 may have an inverse tapered structure in which a width W2 of a lower surface is narrower than a width W3 of an upper surface.

In the display panel 110 according to another embodiment of the present disclosure, the light emitting layer 282 and the second electrode 283 of the light emitting diode 280 are provided even in the non-display area NDA as well as the display area DA. At this time, the light emitting layer 282 and the second electrode 283 of the light emitting diode 280 may be short-circuited by the third organic pattern OP3.

In detail, the third organic pattern OP3 is provided to be spaced apart from the organic films provided in the display area DA, for example, the planarization film 260, the bank 284 and the spacer 285. Therefore, sides of the planarization film 260, the bank 284 and the spacer 285, which are provided in the display area DA, are exposed between the display area DA and the third organic pattern OP3. The light emitting layer 282 and the second electrode 283 provided in the display area DA may be extended to the non-display area NDA, and may be provided along the sides of the planarization film 260, the bank 284 and the spacer 285, which are exposed from the non-display area NDA.

Also, the light emitting layer 282 and the second electrode 283 are also provided over the third organic pattern OP3 provided in the non-display area NDA. At this time, the light emitting layer 282 and the second electrode 283 may be short-circuited by the third organic pattern OP3 having an undercut structure as shown in FIG. 11. Consequently, the light emitting layer 282 extended from the display area DA is disposed to be spaced apart from the light emitting layer 282 provided over the third organic pattern OP3. The second electrode 283 extended from the display area DA is disposed to be spaced apart from the second electrode 283 provided over the third organic pattern OP3.

Therefore, even though water or oxygen enters the light emitting layer 282 or the second electrode 283 provided over the third organic pattern OP3, water or oxygen may be prevented from being propagated into the light emitting layer 282 or the second electrode 283 provided in the display area DA through the light emitting layer 282 or the second electrode 283 provided over the third organic pattern OP3.

The first organic pattern OP1 is provided over a plurality of signal lines SL. The first organic pattern OP1 prevents the plurality of signal lines SL of the non-display area NDA from being damaged by particles entering the inside of the display panel 110.

The first organic pattern OP1 may be made of an organic material having an impact absorption rate better than that of an inorganic material to absorb the pressure applied to the particles. Therefore, the first organic pattern OP1 may reduce the pressure delivered to the plurality of signal lines SL. Also, the first organic pattern OP1 may be provided at a thickness enough to prevent the plurality of lines SL from being damaged by particles even though the pressure is applied thereto.

The first organic pattern OP1 is spaced apart from the third organic pattern OP3, and thus, as shown in FIG. 9, may be formed in a shape of line surrounding the third organic pattern OP3. The first organic pattern OP1 may be an outmost organic pattern disposed adjacent to the end of the first substrate 111.

The first organic pattern OP1 may have a two-layered structure that includes a first layer 3101 and a second layer 3201, as shown in FIGS. 10 and 11. In this case, each of the first layer 3101 and the second layer 3201 of the first organic pattern OP1 may be formed of the same material as that of any one of the planarization film 260, the bank 284 and the spacer 285 of the display area DA.

For example, the first layer 3101 of the first organic pattern OP1 may be formed of the same material as that of the bank 284 of the display area DA simultaneously with the bank 284. The second layer 3201 of the first organic pattern OP1 may be formed of the same material as that of the spacer 285 of the display area DA simultaneously with the spacer 285.

For another example, the first layer 3101 of the first organic pattern OP1 may be formed of the same material as that of the planarization film 260 of the display area DA simultaneously with the planarization film 260. The second layer 3201 of the first organic pattern OP1 may be formed of the same material as that of the bank 284 of the display area DA simultaneously with the bank 284.

The first organic pattern OP1, as shown in FIGS. 10 and 11, may have an undercut structure in which a width of the second layer 3201 is wider than that of the first layer 3101. The first organic pattern OP1 may be an undercut organic pattern in the same manner as the third organic pattern OP3.

Since the undercut structure of the first organic pattern OP1 is substantially the same as the third organic pattern OP3, its detailed description will be omitted.

In the display panel 110 according to one embodiment of the present disclosure, the light emitting layer 282 and the second electrode 283 of the light emitting diode 280 are provided even in the non-display area NDA as well as the display area DA. At this time, the light emitting layer 282 and the second electrode 283 may be short-circuited by the first organic pattern OP1 having an undercut structure as shown in FIG. 11.

Consequently, a light emitting layer 282a provided over the first organic pattern OP1 is disposed to be spaced apart from a light emitting layer 282c provided between the end of the first substrate 111 and the first organic pattern OP1. The light emitting layer 282a provided over the first organic pattern OP1 is disposed to be spaced apart from a light emitting layer 282b provided between the first organic pattern OP1 and the third organic pattern OP3.

Also, a second electrode 283a provided over the first organic pattern OP1 is disposed to be spaced apart from a second electrode 283c provided between the end of the first substrate 111 and the first organic pattern OP1. The second electrode 283a provided over the first organic pattern OP1 is disposed to be spaced apart from a second electrode 283b provided between the first organic pattern OP1 and the third organic pattern OP3.

Therefore, water or oxygen entering the light emitting layer 282c or the second electrode 283c provided between the end of the first substrate 111 and the first organic pattern OP1 may be prevented from being propagated into the light emitting layer 282a or the second electrode 283a provided in the first organic pattern OP1. Also, even though water or oxygen enters the light emitting layer 282a or the second electrode 283a provided over the first organic pattern OP1, water or oxygen may be prevented from being propagated into the light emitting layer 282 or the second electrode 283 provided in the display area DA through the light emitting layer 282a or the second electrode 283a provided over the first organic pattern OP1.

The fourth organic pattern OP4 is provided over a plurality of signal lines SL, and is provided between the first organic pattern OP1 and the third organic pattern OP3. The fourth organic pattern OP4 prevents the plurality of signal lines SL of the non-display area NDA from being damaged by particles entering the inside of the display panel 110.

The fourth organic pattern OP4 may be made of an organic material having an impact absorption rate better than that of an inorganic material to absorb the pressure applied to the particles as the first and third organic patterns OP1 and OP3. Therefore, the fourth organic pattern OP4 may reduce the pressure delivered to the plurality of signal lines SL. Also, the fourth organic pattern OP4 may be formed at a thickness enough to prevent the plurality of lines SL from being damaged by particles even though the pressure is applied thereto.

The fourth organic pattern OP4 is spaced apart from each of the first organic pattern OP1 and the third organic pattern OP3 between the first organic pattern OP1 and the third organic pattern OP3. The fourth organic pattern OP4, as shown in FIG. 9, may have, but is not limited to, a polygonal shape. The fourth organic pattern OP4 may have a line shape in the same manner as the first and third organic patterns OP1 and OP3, or may have a circular shape.

Also, a plurality of the fourth organic patterns OP4 may be spaced apart from one another as shown in FIG. 9 but are not limited thereto. The fourth organic pattern OP4 may have a line shape.

The fourth organic pattern OP4 may have a two-layered structure that includes a first layer 3104 and a second layer 3204, as shown in FIGS. 10 and 12. In this case, each of the first layer 3104 and the second layer 3204 of the fourth organic pattern OP4 may be formed of the same material as that of any one of the planarization film 260, the bank 284 and the spacer 285 of the display area DA.

For example, the first layer 3104 of the fourth organic pattern OP4 may be formed of the same material as that of the bank 284 of the display area DA simultaneously with the bank 284. The second layer 3204 of the fourth organic pattern OP4 may be formed of the same material as that of the spacer 285 of the display area DA simultaneously with the spacer 285.

For another example, the first layer 3104 of the fourth organic pattern OP4 may be formed of the same material as that of the planarization film 260 of the display area DA simultaneously with the planarization film 260. The second layer 3204 of the fourth organic pattern OP4 may be formed of the same material as that of the bank 284 of the display area DA simultaneously with the bank 284.

The fourth organic pattern OP4, as shown in FIGS. 10 and 12, may have a stack structure in which a width of the second layer 3204 is narrower than that of the first layer 3104. The fourth organic pattern OP4 may be a stack organic pattern unlike the first and third organic patterns OP1 and OP3.

In detail, the first layer 3104 of the fourth organic pattern OP4 may have a forward tapered structure in which a width W4 of a lower surface is wider than a width W5 of an upper surface. The second layer 3204 of the fourth organic pattern OP4 may have a forward tapered structure in which the width W5 of the lower surface is wider than a width W6 of an upper surface. The lower surface of the second layer 3204 adjoins the upper surface of the first layer 3104 and thus has the same width as the width W5 of the upper surface of the first layer 3104.

Although FIGS. 10 and 12 show that the first layer 3104 and the second layer 3204 of the fourth organic pattern OP4 are respectively provided to be patterned, the present disclosure is not limited thereto. In another embodiment, the fourth organic pattern OP4 may include a plurality of second patterns 3204 arranged over one first layer 3104 as shown in FIG. 13.

In the display panel 110 according to another embodiment of the present disclosure, the light emitting layer 282 and the second electrode 283 of the light emitting diode 280 are provided even in the non-display area NDA as well as the display area DA. At this time, the light emitting layer 282 and the second electrode 283 provided in the non-display area NDA are continuously provided over the fourth organic pattern OP4. Both the first layer 3104 and the second layer 3204 of the fourth organic pattern OP4, as shown in FIG. 12, have a forward tapered structure. Therefore, the light emitting layer 282 and the second electrode 283 may continuously be provided over the fourth organic pattern OP4 without being disconnected.

The display panel 110 according to another embodiment of the present disclosure is different from the display panel 110 according to one embodiment of the present disclosure in that some of the plurality of organic patterns OP has an undercut structure. In the display panel 110 according to another embodiment of the present disclosure, the fourth organic pattern OP4 having a simple stack structure is provided between the first and third organic patterns OP1 and OP3, whereby adhesion between the first substrate 111 and the second substrate 112 may be more improved.

In the display panel 110 according to the present disclosure, a contact area with the adhesive layer 290 may be improved by the organic patterns OP to improve adhesion. However, referring to FIGS. 5 and 10, since the upper surfaces of the organic patterns OP1, OP2 and OP3 having an undercut structure have a width wider than that of the lower surfaces, the adhesive layer 290 may not be provided below the upper surface, and an air gap AG may be generated.

On the other hand, referring to FIG. 10, since an upper surface of the fourth organic pattern OP4 having a simple stack structure has a width narrower than that of a lower surface, the adhesive layer 290 is fully provided over the upper surface. That is, an air gap AG where the adhesive layer 290 is not provided is not generated in the fourth organic pattern OP4.

In the display panel 110 according to another embodiment of the present disclosure, the organic pattern OP4 having a simple stack structure is provided between the organic patterns OP1 and OP3 having an undercut structure, whereby adhesion may be more improved.

Meanwhile, in the display panel 110 according to another embodiment of the present disclosure, the first organic pattern OP1, the third organic pattern OP3 and the fourth organic pattern OP4 are spaced apart from one another. Therefore, the display panel 110 according to another embodiment of the present disclosure may prevent water entering the first organic pattern OP1 from being permeated into the fourth organic pattern OP4. Also, the display panel 110 according to another embodiment of the present disclosure may prevent water or oxygen entering the fourth organic pattern OP4 from being permeated into the third organic pattern OP3. Consequently, the display panel 110 according to one embodiment of the present disclosure may prevent water from being propagated through the organic patterns OP1, OP3 and OP4 despite that the organic patterns OP1, OP3 and OP4 are provided in the non-display area NDA.

Meanwhile, spaced distances S3, S4 and S5 among the first organic pattern OP1, the third organic pattern OP3 and the fourth organic pattern OP4 may be varied depending the thickness of the adhesive layer 290. In this case, the spaced distances S3, S4 and S5 may indicate the distances among the upper surfaces of the organic patterns OP1, OP3 and OP4. For example, the spaced distance S3 may indicate the distance between one end of the upper surface of the first organic pattern OP1 and one end of the upper surface of the fourth organic pattern OP4. At this time, one end of the upper surface of the fourth organic pattern OP4 is an edge that faces one end of the upper surface of the first organic pattern OP1.

In detail, the spaced distances S3, S4 and S5 among the first organic pattern OP1, the third organic pattern OP3 and the fourth organic pattern OP4 are shorter than the distance S2 from the upper surface of the second electrode 283 provided over the organic patterns OP1, OP3 and OP4 to the upper surface of the adhesive layer 290.

The spaced distances S3, S4 and S5 among the first organic pattern OP1, the third organic pattern OP3 and the fourth organic pattern OP4 may be equal to or different from one another. The first organic pattern OP1 may have the first spaced distance S3 with the fourth organic pattern OP4 disposed adjacent to the first organic pattern OP1. The fourth organic patterns OP4 may have the second spaced distance S4. The third organic pattern OP3 may have the third spaced distance S5 with the fourth organic pattern OP4 disposed adjacent to the third organic pattern OP3. The first, second and third distances S3, S4 and S5 may be equal to or different from one another. Even in the case that the spaced distances are different from one another, the first, second and third spaced distances S3, S4 and S5 should be shorter than the distance S2 from the upper surface of the second electrode 283 provided over the organic patterns OP1, OP3 and OP4 to the upper surface of the adhesive layer 290.

Various sized particles may enter the inside of the display panel 110. If a pressure is applied to a first particle P1 which is great in size, the first particle may reach the plurality of signal lines SL by passing through the adhesive layer 290. On the other hand, even though a pressure is applied to a second particle which is smaller, the second particle fails to pass through the adhesive layer 290, thereby failing to reach the plurality of signal lines SL.

The display panel 110 according to another embodiment of the present disclosure may allow the first particle which is great in size not to reach the plurality of signal lines SL by controlling the spaced distances S3, S4 and S5 among the first organic pattern OP1, the third organic pattern OP3 and the fourth organic pattern OP4.

To this end, the display panel 110 according to another embodiment of the present disclosure may be provided to allow the spaced distances S3, S4 and S5 among the first organic pattern OP1, the third organic pattern OP3 and the fourth organic pattern OP4 to be shorter than the distance S2 from the upper surface of the second electrode 283 provided over the organic patterns OP1, OP3 and OP4 to the upper surface of the adhesive layer 290.

The first particle having a diameter greater than the spaced distances S3, S4 and S5 among the first organic pattern OP1, the third organic pattern OP3 and the fourth organic pattern OP4 fails to enter areas among the organic patterns OP1, OP3 and OP4.

The first particle cannot reach the plurality of signal lines SL over the organic patterns OP1, OP3 and OP4 due to the organic patterns OP1, OP3 and OP4. Also, since the first particle has the diameter greater than the spaced distances S3, S4 and S5 among the organic patterns OP1, OP3 and OP4, the first particle fails to enter areas among the organic patterns OP1, OP3 and OP4. Therefore, the first particle cannot reach the plurality of signal lines SL among the organic patterns OP1, OP3 and OP4.

Consequently, since the first particle which is great in size cannot reach the plurality of signal lines SL by passing through the adhesive layer 290, the plurality of signal lines SL may be prevented from being damaged.

In the display panel 110 according to another embodiment of the present disclosure, the adhesive layer 290 includes an adhesive resin 291 and a water absorption material 292, and thus may have an adhesive function and an encapsulation function. Therefore, the display panel 110 according to another embodiment of the present disclosure may reduce its thickness and a width of the non-display area NDA because a separate encapsulation film is not provided.

Also, the display panel 110 according to another embodiment of the present disclosure includes a plurality of organic patterns OP provided in the non-display area NDA. The plurality of organic patterns OP may be disposed over the plurality of signal lines SL to prevent the plurality of signal lines SL from being damaged by particles entering the inside of the display panel 110.

Also, the display panel 110 according to another embodiment of the present disclosure prevents water or oxygen from being delivered to the display area DA through the plurality of organic patterns OP by spacing the organic patterns OP apart from one another.

Also, in the display panel 110 according to another embodiment of the present disclosure, the organic pattern OP4 having a simple stack structure is provided between the organic patterns OP1 and OP3 having an undercut structure, whereby adhesion may be more improved.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:
1. A display device, comprising:
a first substrate including a display area, in which a plurality of subpixels are disposed, and a non-display area surrounding the display area and including a pad area in which a pad is disposed;
a first electrode provided in the display area over the first substrate;
a light emitting layer provided over the first electrode;
a second electrode provided over the light emitting layer;
a plurality of lines provided in the non-display area over the first substrate and electrically connected to at least one of the pad and the plurality of subpixels;

a plurality of organic patterns provided over the plurality of lines and spaced apart from one another;

an adhesive layer provided over the plurality of organic patterns; and a second substrate provided over the adhesive layer, wherein the light emitting layer and the second electrode are provided over the plurality of organic patterns, and spaced distances among the plurality of organic patterns are shorter than a distance from an upper surface of the second electrode provided over the plurality of organic patterns to an upper surface of the adhesive layer.

2. The display device of claim 1, wherein the non-display area includes a first area provided with the plurality of organic patterns and a second area provided among the plurality of organic patterns, and the light emitting layer provided in the first area is spaced apart from the light emitting layer provided in the second area, and the second electrode provided in the first area is spaced apart from the second electrode provided in the second area.

3. The display device of claim 2, wherein the second electrode provided in the second area overlays the light emitting layer provided in the second area.

4. The display device of claim 2, wherein the second electrode provided in the first area overlays the light emitting layer provided in the first area.

5. The display device of claim 1, wherein each of the plurality of organic patterns is spaced apart from the display area, and has a line shape surrounding the display area.

6. The display device of claim 1, wherein the adhesive layer includes a material that absorbs water, and is provided between the second electrode and the second substrate to adhere the second electrode to the second substrate.

7. The display device of claim 1, wherein the plurality of organic patterns include an organic pattern of an inverse tapered structure in which a width of a lower surface is narrower than that of an upper surface.

8. The display device of claim 1, wherein the plurality of organic patterns include an undercut organic pattern comprised of a first layer and a second layer provided over the first layer, having a width wider than that of the first layer.

9. The display device of claim 8, wherein the second layer of the undercut organic pattern has an inverse tapered structure in which a lower surface has a width narrower than that of an upper surface.

10. The display device of claim 8, wherein the plurality of organic patterns further include a stack organic pattern comprised of a third layer and a fourth layer provided over the third layer, having a width equal to or narrower than that of the third layer.

11. The display device of claim 10, wherein an outmost one of the plurality of organic patterns, which is disposed adjacent to an end of the first substrate, is the undercut organic pattern.

12. The display device of claim 10, wherein the undercut organic pattern has a line shape surrounding the display area, and the stack organic pattern has a polygonal shape.

13. A display device, comprising:
a substrate including a display area and a non-display area surrounding the display area;
a first electrode provided in the display area over the substrate;
a light emitting layer provided over the first electrode;
a second electrode provided over the light emitting layer; and
a plurality of organic patterns provided in the non-display area,
wherein the non-display area includes a first area provided with the plurality of organic patterns and a second area provided among the plurality of organic patterns,
the light emitting layer and the second electrode are provided in the display area, the first area and the second area, and are provided over the plurality of organic patterns in the first area, and
wherein the plurality of organic patterns include an undercut organic pattern comprised of a first layer and a second layer provided over the first layer, having a width wider than that of the first layer.

14. The display device of claim 13, wherein the light emitting layer provided in the first area is spaced apart from the light emitting layer provided in the second area, and the second electrode provided in the first area is spaced apart from the second electrode provided in the second area.

15. The display device of claim 13, wherein the second electrode provided in the second area overlays the light emitting layer provided in the second area.

16. The display device of claim 13, wherein each of the plurality of organic patterns is spaced apart from the display area, and has a line shape surrounding the display area.

17. A display device comprising:
a first substrate including a display area, in which a plurality of subpixels are disposed, and a non-display area surrounding the display area and including a pad area in which a pad is disposed;
a first electrode provided in the display area over the first substrate;
a light emitting layer provided over the first electrode;
a second electrode provided over the light emitting layer;
a plurality of lines provided in the non-display area over the first substrate and electrically connected to at least one of the pad and the plurality of subpixels;
a plurality of organic patterns provided over the plurality of lines and spaced apart from one another;
an adhesive layer provided over the plurality of organic patterns; and
a second substrate provided over the adhesive layer,
wherein the light emitting layer and the second electrode are provided over the plurality of organic patterns, and
wherein the plurality of organic patterns include an outmost organic pattern adjacent to an end of the first substrate, an innermost organic pattern adjacent to the display area, and a middle organic pattern between the outmost organic pattern and the innermost organic pattern; and each of the outmost organic pattern and the innermost organic pattern has a first structure in which a width of a top surface is greater than a width of a bottom surface.

18. The display device of claim 17, wherein the middle organic pattern has the first structure.

19. The display device of claim 17, wherein the middle organic pattern has a second structure different from the first structure, in which a width of a top surface is smaller than a width of a bottom surface.

20. The display device of claim 19, wherein the middle organic pattern is provided in plurality.

* * * * *